US006472798B2

(12) United States Patent
Kishimoto

(10) Patent No.: US 6,472,798 B2
(45) Date of Patent: Oct. 29, 2002

(54) PIEZOELECTRIC ACOUSTIC COMPONENTS

(75) Inventor: Takeshi Kishimoto, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/734,122

(22) Filed: Dec. 11, 2000

(65) Prior Publication Data

US 2001/0004180 A1 Jun. 21, 2001

(30) Foreign Application Priority Data

Dec. 16, 1999 (JP) ........................................ 11-357156
Aug. 25, 2000 (JP) ........................................ 2000-255095

(51) Int. Cl.7 ........................................ H01L 41/08

(52) U.S. Cl. ........................ 310/344; 310/345; 310/348; 310/324; 310/332; 310/359

(58) Field of Search ........................ 310/324, 344, 310/345, 346, 348

(56) References Cited

U.S. PATENT DOCUMENTS 4,352,961 A * 10/1982 Kumada et al. ........ 310/321 X
4,486,742 A * 12/1984 Kudo et al. ............. 310/324 X
4,527,105 A * 7/1985 Shiraishi ..................... 318/443
5,371,428 A * 12/1994 Kikuchi et al. ............. 310/324
5,856,956 A * 1/1999 Toki ....................... 310/324 X
5,955,821 A * 9/1999 Yamamoto et al. ......... 310/324
RE36,828 E * 8/2000 Tajima et al. ........... 310/322 X
6,307,300 B1 * 10/2001 Yamamoto .............. 310/344 X

* cited by examiner

*Primary Examiner*—Mark O. Budd
(74) *Attorney, Agent, or Firm*—Keating & Bennett, LLP

(57) ABSTRACT

A piezoelectric acoustic component having excellent efficiencies of productivity and of acoustic conversion, a greatly miniaturized size, and excellent impact resistance properties, includes a unimorph type diaphragm. The unimorph type diaphragm is defined by adhering a substantially square piezoelectric element onto a substantially square metal plate, the shorter sides of the diaphragm are supported on the supporting portion provided within the two opposing side wall portions of the case, the clearance between the remaining two sides of the diaphragm, and the case is sealed with a resilient sealing agent. The case is adhered on the substrate having external electrodes, the metal plate is connected to the external electrode with a resilient conductive paste, and the surface electrode of the piezoelectric element is connected to the external electrode with a resilient conductive paste. In this arrangement, the reliability of connection between the diaphragm and the external terminals on the substrate against the impact is greatly improved.

36 Claims, 6 Drawing Sheets

CIRCULAR DIAPHRAGM

SQUARE DIAPHRAGM

PIEZOELECTRIC ACOUSTIC COMPONENTS

BACKGROUND OF THE INVENTION

1. Field of the Invention

The present invention relates to a piezoelectric acoustic component, and more particularly, to a piezoelectric buzzer or a piezoelectric receiver and a method of manufacturing the same.

2. Description of the Related Art

Conventionally, a piezoelectric acoustic component is widely used as a piezoelectric buzzer or a piezoelectric receiver that generates an alarm sound or an operating sound in electronic equipment, household electrical appliances, or mobile telephones. This type of piezoelectric acoustic component is generally manufactured by the steps of adhering a circular piezoelectric element on one of the surfaces of a circular metal plate to provide a unimorph type diaphragm, retaining the peripheral edge of the metal plate in the circular case with silicone rubber, and closing the opening of the case with a cover.

However, the circular diaphragm has a reduced productive efficiency, and thus, the efficiency of acoustic conversion is low, and miniaturization is difficult.

Accordingly, the applicant of the present invention disclosed in Japanese Unexamined Patent Application No. 11-293204 a piezoelectric acoustic component in which a square diaphragm is used to improve the efficiency of productivity and acoustic conversion, and to enable miniaturization. This piezoelectric acoustic component includes a diaphragm having a square piezoelectric element attached on one of surfaces of the square metal plate and an insulating case having a top wall portion, four side wall portions, and a supporting portions within two opposing side walls, and a plate substrate provided with first and second external electrodes, wherein the diaphragm is mounted in the case, the opposing two sides of the diaphragm and the supporting portion are fixed by the supporting material, and the clearance between the remaining two sides of the diaphragm and the case is sealed by a resilient sealing material such that the acoustic space is defined between the diaphragm and the top wall portion of the case. Then, the end of an opening provided on the side wall of the case is adhered onto the substrate, the metal plate is electrically connected to the first external electrode, and the electrode of the piezoelectric element is electrically connected to the second external electrode.

In the currently manufactured electronic components, surface mounting using a reflow soldering method is generally used, and the components are assembled primarily by a machine. Thus, the piezoelectric acoustic component must also have a surface mounted structure. To this end, it is preferable to connect the diaphragm and the external electrode of the substrate electrically using a conductive adhesive. However, when a conventional epoxy conductive adhesive is used, sufficient performance cannot be obtained in terms of sound pressure characteristics and impact resistant properties. In other words, in mobile equipment such as a mobile telephone which is susceptible to large impact loads, for example, by dropping it on the floor accidentally, an epoxy conductive adhesive may be cracked due to the impact load, thereby disconnecting the diaphragm and the external electrode of the substrate.

SUMMARY OF THE INVENTION

To overcome the above-described problems, preferred embodiments of the present invention provide a piezoelectric acoustic component having excellent efficiencies of productivity and acoustic conversion, a greatly miniaturized size, and having excellent impact resistance properties.

According to a first preferred embodiment of the present invention, a piezoelectric acoustic component includes a square piezoelectric diaphragm having first and second diaphragm electrodes exposed on one end portion thereof and vibrating in the length bending mode, an insulating case having a top wall portion, four side wall portions, and supporting portions inside of two opposing side walls, and a substrate in the shape of a plate having first and second external electrodes thereon, wherein the diaphragm is stored within the case with the surface exposing the first and the second diaphragm electrodes facing toward the opposite side of the case from the top wall portion, the two opposite sides of the diaphragm are supported on the supporting portion with supporting material, and the clearance between the diaphragm and the remaining two sides are sealed with a resilient sealing material such that an acoustic space is defined between the diaphragm and the top wall portion of the case, the end of an opening provided on a side wall portion of the case is adhered onto the substrate, the first diaphragm electrode on the diaphragm is electrically connected to the first external electrode with a resilient conductive adhesive, and the second diaphragm electrode is electrically connected to the second external electrode with a resilient conductive adhesive.

According to a second preferred embodiment of the present invention, a piezoelectric acoustic component includes a square piezoelectric diaphragm having first and second diaphragm electrodes exposed on one of the end portions thereof and vibrating in the area bending mode, an insulating case having a top wall portion, four side wall portions, and a supporting portion inside of the four side wall portions, and a substrate in the shape of a plate having first and second external electrodes thereon, wherein the diaphragm is stored in the case with the surface exposing the first and the second diaphragm electrodes facing toward the opposite side of the case from the top wall portion, the four sides of the diaphragm are supported on the supporting portion with supporting material such that the acoustic space is defined between the diaphragm and the case, the end of an opening provided on a side wall portion of the case is adhered onto the substrate, the first diaphragm electrode of the diaphragm is electrically connected to the first external electrode with a resilient conductive adhesive, and the second diaphragm electrode is electrically connected to the second external electrode with a resilient conductive adhesive.

Another preferred embodiment of the present invention provides a method of manufacturing a piezoelectric acoustic component including the steps of providing a square piezoelectric diaphragm having first and second diaphragm electrodes exposed on one of the end portions thereof and vibrating in the length bending mode, providing an insulating case having a top wall portion, four side wall portions, and supporting portions inside of the opposing two side walls, and providing a substrate in the shape of a plate having first and a second external electrodes thereon, storing the diaphragm within the case with the surface exposing the first and the second diaphragm electrodes facing toward the opposite side of the case from the top wall portion and supporting the two opposite sides of the diaphragm on the supporting portion with supporting material, and sealing the clearance between the diaphragm and the remaining two sides with a resilient sealing material such that an acoustic space is defined between the diaphragm and the top wall portion of the case, applying a resilient conductive adhesive continuously from the first diaphragm electrode of the diaphragm to the end of an opening provided on a side wall portion of the case, applying a resilient conductive adhesive continuously from the second diaphragm electrode to the end of the opening provided on the side wall portion of the case, applying an insulating adhesive on the upper surface of the substrate or the end of the opening provided on the side wall portion of the case, adhering the end of the opening provided on the side wall portion of the case on the substrate with an insulating adhesive and connecting the first diaphragm electrode and the first external electrode, and the second diaphragm electrode and the second external electrode alternately with a conductive adhesive, and curing the insulating adhesive and a conductive adhesive simultaneously.

A further preferred embodiment of the present invention provides a method of manufacturing a piezoelectric acoustic component including the steps of providing a square piezoelectric diaphragm having first and second diaphragm electrodes exposed on one of the end portions thereof and vibrating in the area bending mode, providing an insulating case having a top wall portion, four side wall portions, and a supporting portion inside of the four side wall portions, providing a substrate in the shape of a plate having first and second external electrodes thereon, storing the diaphragm in the case with a surface exposing the first and second diaphragm electrodes facing toward the opposite side of the case from the top wall portion and supporting the four sides of the diaphragm on the supporting portion with supporting material such that the acoustic space is defined between the diaphragm and the case, applying a resilient conductive adhesive continuously from the second diaphragm electrode to an end of an opening provided on the side wall portion of the case, applying an insulating adhesive on the upper surface of the substrate or the end of the opening formed on the side wall portion of the case, adhering the end of the opening formed on the side wall portion of the case on the substrate with an insulating adhesive and connecting the first diaphragm electrode and the first external electrode, and the second diaphragm electrode and the second external electrode alternately with a conductive adhesive, and curing the insulating adhesive and a conductive adhesive simultaneously.

Since the piezoelectric element constituting the diaphragm is substantially square, the quantity of waste generated when the piezoelectric element is punched out of the green sheet is greatly reduced, and thus the material efficiency is greatly improved. Since the formation of the electrode and the polarization are performed in the state of a parent substrate, the production efficiency is greatly improved. Since the dimensions required for design are determined by the cut dimensions of the parent substrate, it is not necessary to produce a punch die for die-cutting the green sheet every time as is the case of the disc type piezoelectric element. In other words, since the types of the punch die, jig, or piezoelectric bodies used in the steps of die-cutting the green sheet to cutting the parent substrate are greatly reduced in comparison with the related art, the manufacture of the piezoelectric element is much less expensive and more efficient.

The first preferred embodiment of the present invention is suitable for a receiver. Since this preferred embodiment can be adapted to a wide range of frequencies, in addition to the resonant range, ranges other than the resonant range are also used. The opposite two sides of the substantially square diaphragm are supported on the supporting portion of the case with the supporting material, and the clearance between the remaining two sides and the case is sealed with the resilient sealing agent such that the piezoelectric element is displaced even when the vibrational energy of the diaphragm is relatively small. When a prescribed frequency signal is applied between the two diaphragm electrodes of the diaphragm, the piezoelectric element dilates and contracts in the prescribed direction, and the diaphragm is bent and deformed in the bending mode accordingly. At this time, when the diaphragm vibrates in the vertical direction with both ends fixed to the case as nodes, and the points of the maximum displacement P exist along the longitudinal centerline of the diaphragm as shown in FIG. 1B. In FIG. 1, the diaphragm of the unimorph type is shown as an example for clarity. In contrast, in the case of the diaphragm having a disc shape, the point of the maximum displacement P exists only at the center thereof as shown in FIG. 1A. In other words, the volume of displacement of the square diaphragm is much larger than that of the disc shaped diaphragm. Since the volume of displacement corresponds to energy for moving air, the efficiency of the acoustic conversion is greatly enhanced. Also, because the clearance between both ends along the width of the diaphragm are sealed with a sealing agent, which is resilient, displacement of the diaphragm is not hindered and thereby the sound pressure is not reduced. In addition, though both shorter ends of the diaphragm are fixed, the portion between both ends is freely displaced, and thus, lower frequency sound is produced in comparison with the disc-shaped diaphragm. In other words, to obtain the sound having the same frequency as the disc-shaped diaphragm, the dimensions are greatly reduced.

On the other hand, the second preferred embodiment of the present invention is suitable for a sounder or a ringer, and used in the resonant region in order to support a large volume at a single frequency. The four sides of the substantially square diaphragm are supported on the supporting portion of the case with the supporting material for providing excitation in the area-bending mode in order to increase vibration energy of the diaphragm. The area-bending mode the diaphragm is substantially rectangular, and the whole area of the diaphragm bends and vibrates in the direction of the thickness such that the area of the two diagonal lines that constitute the main surface of the diaphragm provides the largest displacement, in other words, such that the intersection of the diagonal lines provides the largest displacement.

In various preferred embodiments of the present invention, the supporting material is preferably a material that has a high Young's modulus in the cured state and restrains the end portion of the diaphragm strongly, such as an epoxy adhesive, or a material that has a low Young's modulus in the cured state, and that is weak in the force to bind the diaphragm and accepts the displacement of the diaphragm such as a resilient sealing agent, for example, silicone rubber.

FIG. 2 is a comparative drawing showing the relation between the dimensions of the circular diaphragm and the substantially square diaphragm and the resonant frequency. In this case as well, the diaphragm of unimorph type is used.

For comparison, PZT having a thickness of about 50 $\mu$m is used as a piezoelectric element, and 42 Ni having a thickness of about 50$\mu$m is used as a metal plate. The ratio between the length L and the width W of the substantially rectangular diaphragm is 1.67.

As is clearly shown in the drawing, when the frequency is the same, the square diaphragm may be reduced in dimensions (length, diameter) in comparison with the circular diaphragm. In other words, when the dimensions are the same, much lower frequency can be obtained.

In various preferred embodiments of the present invention, the case having the diaphragm fixed thereon is adhered and fixed on the substrate so as to have a plate-shaped configuration. Then, the first diaphragm electrode is electrically connected to the first external electrode with a resilient conductive adhesive, and the second diaphragm electrode is electrically connected to the second external electrode with a resilient conductive adhesive to produce a completed acoustic component. By drawing the first and the second external electrode provided on the substrate to the back surface of the substrate, a surface mounted structure is obtained.

Since the conducive adhesive has resiliency, it resists cracks even when the equipment having the piezoelectric acoustic component mounted thereon is subject to a large impact load by accidentally dropping it on the floor, thereby preventing disconnection between the diaphragm electrode and the external electrode. In addition, since Young's modulus of the conductive adhesive in the cured state is low, vibration of the diaphragm is not restrained, thus the sound pressure is not lowered.

Preferably, as in a third preferred embodiment of the present invention, a unimorph type piezoelectric diaphragm having a piezoelectric element adhered on one of the surfaces of the metal plate at the position displaced toward one of the side which is supported by the supporting portion of the case is used as a diaphragm, the electrode on one of the surfaces of the piezoelectric element exposed outside constitutes the first diaphragm electrode, an exposed portion of the metal plate is provided on the other side of the surface having a piezoelectric element of the diaphragm is adhered, the exposed portion constitutes the second diaphragm electrode, and the diaphragm is mounted to the case with the metal plate facing toward the top wall of the case. Though it is also possible to mount the diaphragm to the case with the piezoelectric element facing toward the top wall portion, it would be difficult to connect the surface electrode of the piezoelectric element to the second external electrode of the substrate because the surface electrode of the piezoelectric element and the substrate do not face each other in such a case. In contrast, when the diaphragm is fixed to the case with the metal plate facing toward the top wall portion of the case, connection between the surface electrode and the second external electrode with a conductive adhesive is easily made because the surface electrode of the piezoelectric element and the substrate face each other. Since the exposed portion of the metal plate is exposed on one side of the diaphragm, connection between the metal plate and the first external electrode is also easily made.

As in a fourth preferred embodiment of the present invention, by using a conductive adhesive having a Young's modulus of about $1\times10^5$–$2\times10^9$ N/m$^2$ in the cured state as a resilient conductive adhesive, an excellent effect is obtained in terms of impact resistance and sound pressure characteristics. In this case, the Vickers hardness in the cured state will be about 30–100.

Preferably, as in a fifth preferred embodiment of the present invention, the supporting material that supports the two opposing sides of the diaphragm onto the supporting portion is formed of the same material as the resilient sealing agent, in other words, a resilient sealing material is applied on all the four sides of the diaphragm. Sealing the periphery of the diaphragm with a resilient sealing material prevents air from leaking and greatly improves the sound pressure characteristics.

By manufacturing a piezoelectric acoustic component according to the steps as set forth in the sixth preferred embodiment of the present invention, fixing of the diaphragm and the case, fixing of the case and the substrate, and electrical connection between the piezoelectric board and the external electrode on the substrate are performed in a smaller numbers of steps of the same types, whereby the piezoelectric acoustic component according to the first preferred embodiment of the present invention is manufactured at a greatly reduced cost.

Likewise, by manufacturing the piezoelectric acoustic component according to the steps as set forth in the seventh preferred embodiment of the present invention, the piezoelectric acoustic component according to the second preferred embodiment of the present invention is manufactured at a greatly reduced cost.

Other features, elements, characteristics and advantages of the present invention will become more apparent from the following detailed description of preferred embodiments with reference to the attached drawings.

DETAILED DESCRIPTION OF PREFERRED EMBODIMENTS

FIG. 3 to FIG. 6 are drawings showing a surface mounted piezoelectric acoustic component according to the first preferred embodiment of the present invention. This piezoelectric acoustic component is suitable for use as a receiver, and generally includes a unimorph type diaphragm 1, a case 4, and a substrate 10.

Figure 6:
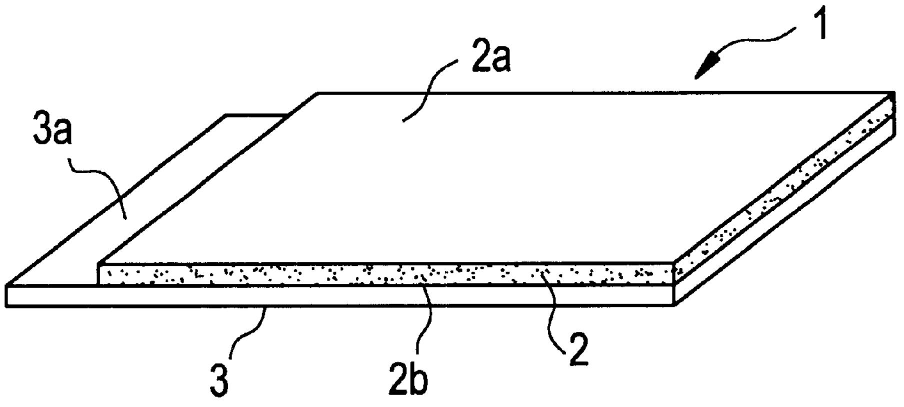
FIG. 6 is a perspective view of the diaphragm.

The diaphragm 1 includes, as shown in FIG. 6, electrodes 2*a* and 2*b* made of thin film or thick film on the surfaces thereof, a substantially rectangular piezoelectric element 2 polarized in the direction of thickness, and a metal plate 3 having the same width as, and a somewhat larger length than the piezoelectric element 2 and adhered to the back surface electrode 2*b* of the piezoelectric element 2 in a face to face manner with a conductive adhesive. The back surface electrode 2*b* may be omitted by directly adhering the metal plate 3 onto the back surface of the piezoelectric element 2 via a conductive adhesive. In this preferred embodiment, the piezoelectric element 2 is adhered to the metal plate 3 at a position displaced along its length to one side, and thus the other side of the metal plate 3 is exposed as an exposed portion 3*a*.

As a piezoelectric element, a piezoelectric ceramic such as PZT is preferably used. The metal plate 3 is preferably made of a material having excellent good conductivity and spring resiliency, more preferably, of a material having Young's modulus close to that of the piezoelectric element 2. To this end, phosphor bronze or 42Ni, for example, is preferably used. When the metal plate 3 is made of 42Ni, the reliability is further improved, because the coefficient of thermal expansion thereof is close to that of ceramic (PZT, etc.).

The diaphragm 1 is preferably manufactured according to the following steps. As a first step, a substantially square parent substrate is punched out from the ceramic green sheet with a punch die, and the parent substrate is provided with electrodes and polarized, and then adhered to a motherboard such as a metal plate with a conductive adhesive. Then, the parent substrate and the mother metal plate adhered together are cut into substantially square shapes along the lengthwise and widthwise cut lines using a dicer or other suitable device to obtain the diaphragms. By using the substantially square metal plate 3 and the substantially square piezoelectric element 2 as described above, the material efficiency and the productive efficiency are greatly improved and the equipment cost is greatly reduced.

The diaphragm 1 described above is stored within the case 4. In other words, the case 4 is made of an insulating material such as ceramic or resin into the shape of a box having a top wall portion 4*a* and four side wall portions 4*b*, and the supporting portion 4*c* for supporting both ends of the diaphragm 1 within the opposing two side wall portions 4*b* is integrally formed. Preferably, the supporting portion 4*c* is as small as possible for improving the sound pressure and lowering the resonant frequency. Where the case 4 is made of resin, it is preferable to use heat resistant resin such as LCP (liquid crystal polymer), SPS (syndiotactic polystyrene), PPS (polyphenylene sulfide), or epoxy. A sound releasing hole 4*d* is provided at the approximate center of the top wall portion 4*a*, and grooves 4*e* are provided on the opening edges of the two opposing side wall portions 4*b*, and the opening edge of one of two remaining side walls 4*b* is provided with a braking notch 4*f*. The grooves 4*e* are provided at positions corresponding to the external electrodes 13, 14 of the substrate 10 described below.

Figure 1A:
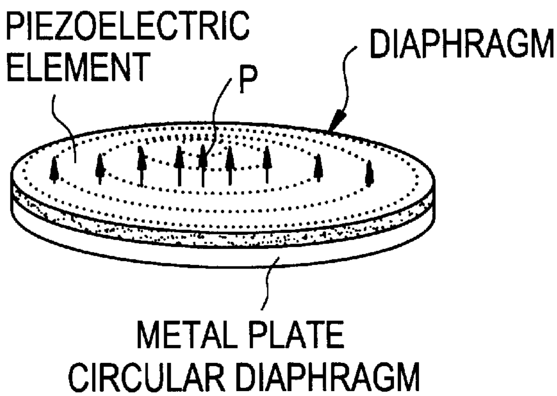
FIGS. 1A and 1B show a comparative drawing showing the distribution of displacement for a circular diaphragm and a substantially square diaphragm.
Figure 1B:
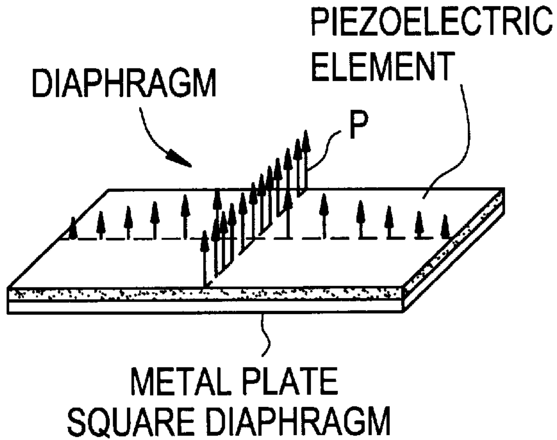
Figure 2:
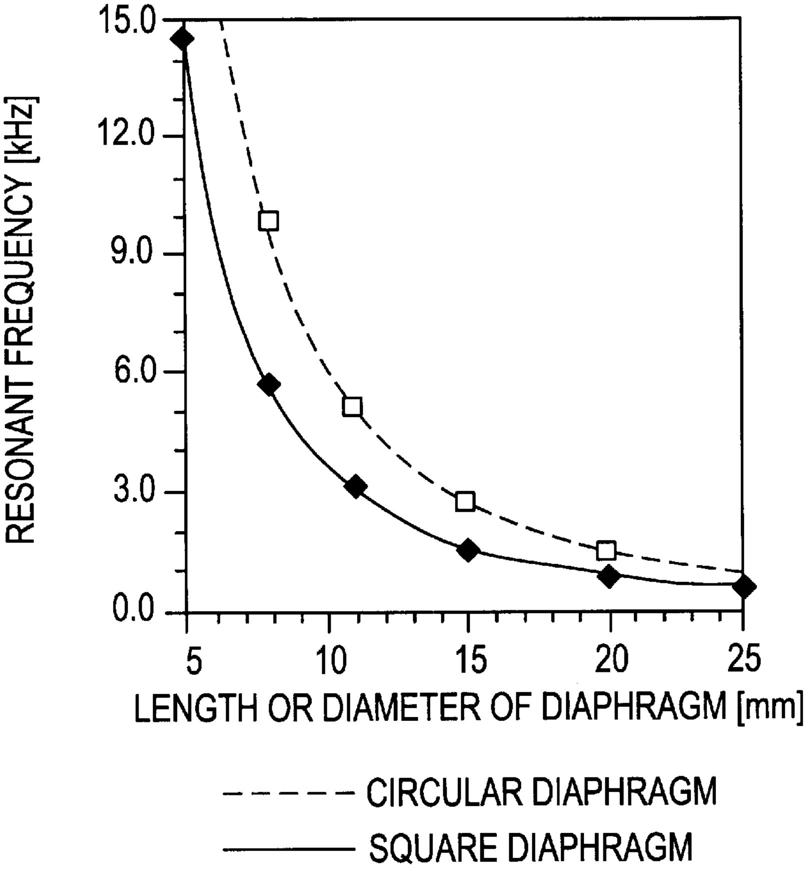
FIG. 2 is a drawing showing a relationship between the dimensions of the circular diaphragm and a substantially square diaphragm and the resonant frequency.
Figure 3:
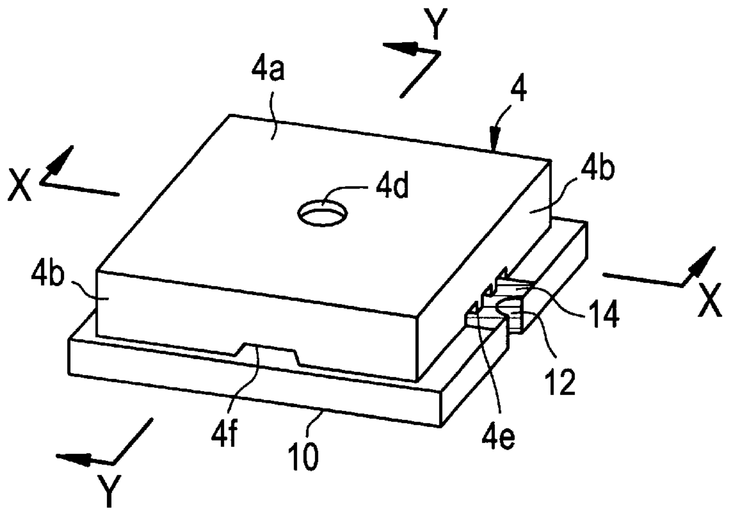
FIG. 3 is a perspective view of a piezoelectric acoustic component according to the first preferred embodiment of the present invention.
Figure 4:
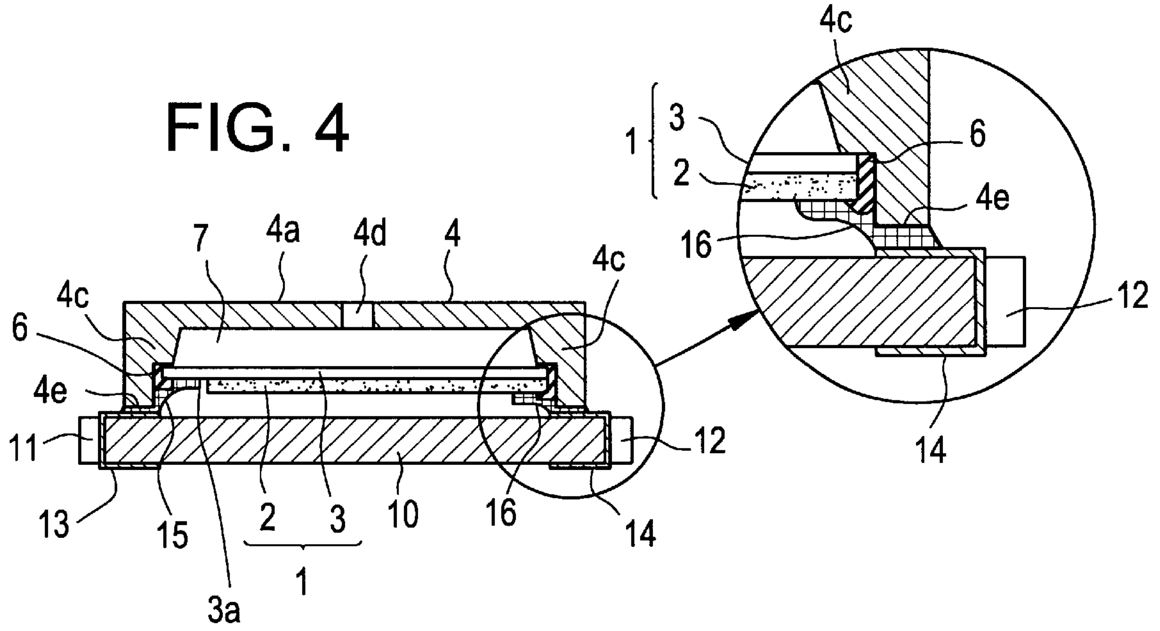
FIG. 4 is a cross sectional view taken along the line X—X in FIG. 3.
Figure 5:
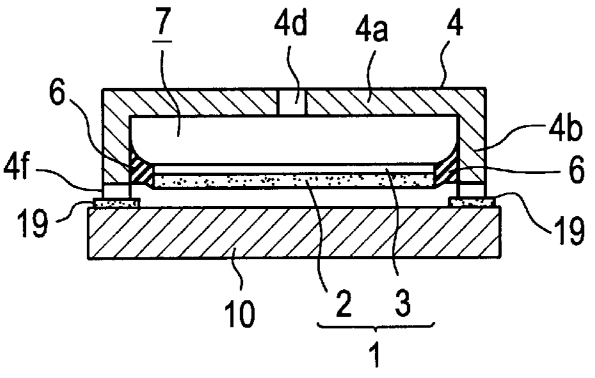
FIG. 5 is a cross sectional view taken along the line Y—Y in FIG. 3.

The diaphragm 1 is stored in the case 4 such that the metal plate 3 faces toward the top wall portion 4*a*, and the shorter sides of the diaphragm are placed on the supporting portion 4*c* and fixed with a resilient sealing agent 6 (See FIG. 4). The resilient sealing agent 6 is preferably one of known materials of the urethane family or of the silicone family. A small clearance is provided between the longer sides of the diaphragm 1 and the inner surface of the case 4, and sealed with the resilient sealing agent 6. In other words, the periphery of the diaphragm 1 is fixed to the case 4 and sealed with the resilient sealing agent 6, whereby an acoustic space 7 is defined between the diaphragm 1 and the top wall portion 4*a* of the case 4.

The case 4 including a diaphragm 1 mounted thereon is adhered on the substrate 10 with an insulating adhesive 19. The substrate is made of an insulating material such as ceramic or resin in the shape of a substantially rectangular plate. When it is made of resin, heat resistant resins such as LCP, SPS, PPS, or epoxy (including glass epoxy) are used. The shorter ends of the substrate 10 are provided with external electrodes 13, 14 extending from the front surface to the back surface via a through hole grooves 11, 12. The electrodes of the diaphragm located on both ends of the diaphragm 1, that is, the exposed portion 3*a* of the metal plate 3 and the front surface electrode 2*a* of the piezoelectric element 2 are electrically connected to the external electrodes 13, 14 respectively with conductive paste 15, 16. Conductive paste 15, 16 is provided to have a certain thickness by being incorporated within the grooves 4*e* provided on the opening edges of the case 4 to prevent disconnection by being impacted by the case 4. The conductive paste 15, 16 is preferably formed of a flexible conductive adhesive of the urethane family or of the silicone family having Young's modulus of $1\times10^5$–$2\times10^9$N/m$^2$ (Vickers hardness: 30–100) in the cured state. The amount of application of conductive paste 15, 16 is preferably a small amount such as approximately 2.5 mg±0.5 mg for preventing lowering of the sound pressure due to excessive application.

Since the shorter ends of the diaphragm 1 are supported by the supporting portion 4*c* of the case 4 and the longer ends of the diaphragm 1 are retained with the resilient sealing agent 6 so as to be resiliently displaceable, when a signal of a prescribed frequency (an alternating signal or rectangular wave signal) is applied between the external electrodes 13, 14 provided on the substrate, the diaphragm 1 vibrates in a length bending mode putting fulcrums on the shorter ends to generate a prescribed sound. The sound is released from the sound releasing hole 4*d* of the case 4.

The result of the drop test conducted for a piezoelectric acoustic component having the structure as described above will be shown below.

[Drop Test]

Conditions: A piezoelectric acoustic component was mounted on the jig of 100 g in weight and dropped from the height of 150 cm in the direction of Z (with the substrate being horizontal) onto the wooden board, and the state of disconnection of conductive paste 15, 16 was examined. When conductive adhesive of urethane family was used:

After 10 times of being dropped in the Z direction, no failure occurred. When conductive adhesive of epoxy family was used:

After 4 times of being dropped in the Z direction, failure in conductivity (open) occurred.

As a result of the test, it was discovered that an excellent impact resistant property was shown when a flexible conductive adhesive of urethane family was used as conductive paste 15, 16 for connecting the electrode of the diaphragm 1 and the external electrodes 13, 14 of the substrate 10 as described above. Young's module of conductive adhesive of urethane family and of conductive adhesive of epoxy family used in this test were $1\times10^9$N/m$^2$ and $5\times10^9$ N/m$^2$ respectively.

Figure 7:
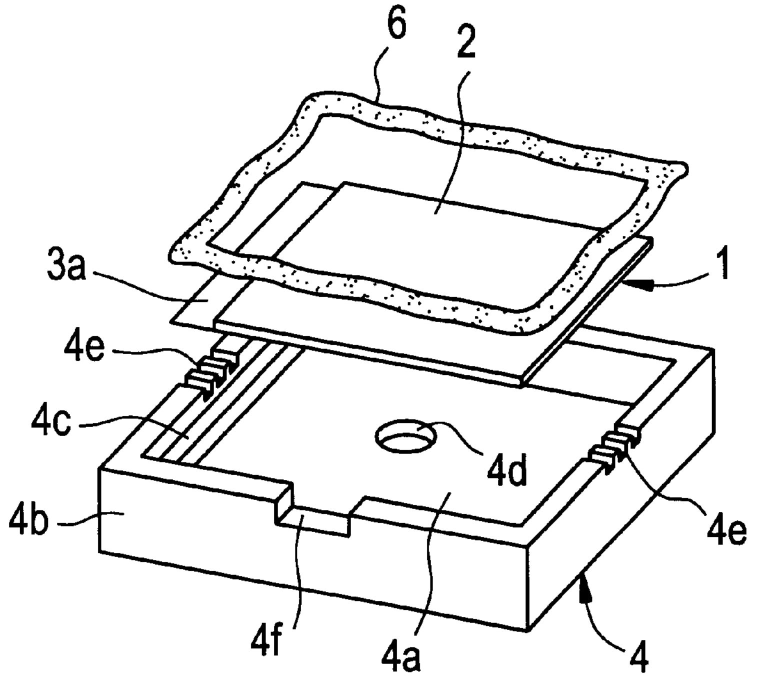
FIG. 7 is an exploded perspective view of the case and the diaphragm viewed from the back side.

Referring now to FIG. 7 and FIG. 8, the method of assembling the piezoelectric acoustic component noted above will be described. As shown in FIG. 7, the diaphragm 1 is stored in the case 4 which is placed upside down with the metal plate 3 facing toward the top wall portion 4*a* of the case 4, and the two shorter sides are placed on the supporting portion 4*c*. In this state, a resilient sealing agent 6 is applied along the periphery of the diaphragm 1 via a dispenser or other suitable device and cured. Consequently, the case 4 with a diaphragm 1 mounted therein is obtained as shown in FIG. 8A.

Figure 8A:
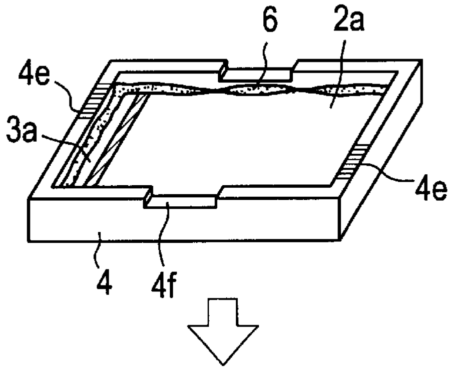
FIGS. 8A–8D show a flow chart showing the method of assembling the case with a diaphragm integrated therein and the substrate.
Figure 8B:
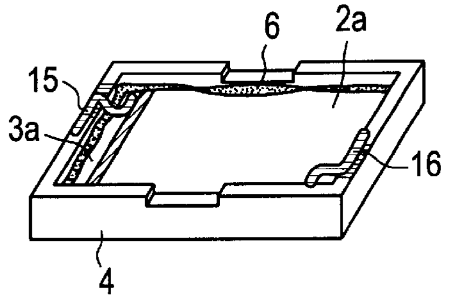

Then, conductive paste 15 is applied continuously from the exposed portion 3*a* of the metal plate located on one end of the diaphragm 1 to the groove 4*e* provided on the opening edge of the case 4 as shown in FIG. 8B. Likewise, conductive paste 16 is applied continuously from the surface electrode 2*a* of the piezoelectric element 2 located the other end of the diaphragm 1 to the groove 4*e* provided on the opening edge of the case 4. In this case, applying conductive paste 15, 16 in the solid hook shape enhances the reliability of conductivity without increasing the amount of application. Since the diaphragm 1 is fixed with the metal plate 3 facing toward the top wall portion 4*a* of the case 4 as is described above, two diaphragm electrodes, that is, the exposed portion 3*a* of the metal plate 3 and the surface electrode 2*a* of the piezoelectric element 2 are exposed from the opening of the case 4. Therefore, the electrodes are easily drawn out by conductive paste 15, 16.

Figure 8C:
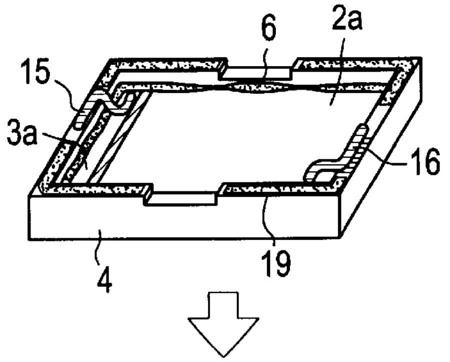

Subsequently, as shown in FIG. 8C, an insulating adhesive 19 is applied onto the portion of the opening edge of the case 4 except for the groove 4*e*. The step of applying adhesive 19 may be done before applying conductive paste 15, 16. In such a case, an adhesive 19 may be applied onto the portion except for the groove 4*e* in a prescribed pattern by printing or transferring technique so that the adhesive 19 and conductive paste 15, 16 do not overlap one another.

Figure 8D:
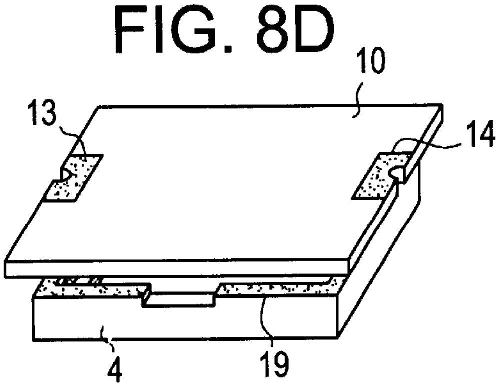

Then, as shown in FIG. 8D, the substrate 10 is adhered on the case 4 before the conductive paste 15, 16 and adhesive 19 are cured. The adhesive 19 then comes into contact with the surface of the substrate 10, and conductive paste 15, 16 come into contact with the external electrode 13, 14, respectively. In this state, when conductive paste 15, 16 and the insulating adhesive 19 are cured by heating or at room temperature, the case 4 and the substrate 10 are integrated, the exposed portion 3*a* of the metal plate 3 and the external electrode 13 on the substrate 10 are connected via conductive paste 15, and the surface electrode 2*a* of the piezoelectric element 2 and the external electrode 14 of the substrate 10 are connected via conductive paste 16, whereby the piezoelectric acoustic component is completed.

In the preferred embodiment described above, although the periphery of the diaphragm 1 is supported/sealed by a resilient sealing agent 6, it is also possible to fix the two shorter sides of the diaphragm 1 to the supporting portion 4*c* with adhesive. However, it is preferable in terms of the sound pressure characteristics to use the resilient sealing agent 6 because it allows the diaphragm to vibrate freely and reliably prevents leakage of air from between the front side and the back side of the diaphragm 1.

Figure 9:
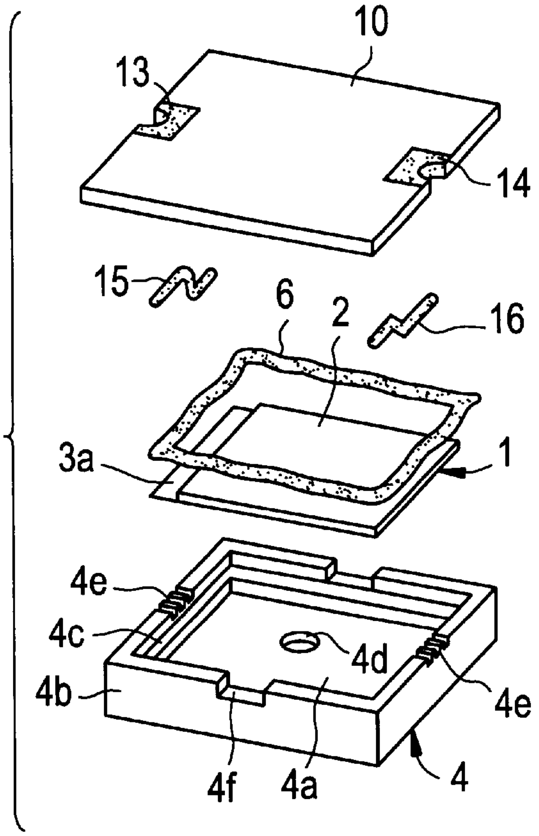
FIG. 9 is a perspective view of the piezoelectric acoustic component according to the second preferred embodiment of the present invention.

FIG. 9 is a piezoelectric acoustic part according to the second preferred embodiment of the present invention.

The piezoelectric acoustic component includes a unimorph type diaphragm 1, a case 4, and a substrate 10. The diaphragm 1 and the substrate 10 are preferably similar to those used in the first preferred embodiment.

FIG. 9 is a perspective back side view showing a state in which the stepped supporting portion 4*c* extends continuously along the inner periphery of the case 4. The top surface of the supporting portion 4*c* has the same height, and all the four sides of the diaphragm 1 are fixed on the supporting portion 4*c* by the supporting material 42, such as an adhesive. The portions identical to those shown in FIG. 7 are designated by the same numerals and the description therefore is omitted.

The piezoelectric acoustic component of this preferred embodiment is used at a single frequency such as in a sounder or the ringer, wherein the whole periphery of the diaphragm 1 is restrained by the supporting material 42, and the diaphragm 1 is used within the resonant region so that it is strongly excited in the area bending mode, thereby obtaining a very large sound.

Figure 10:
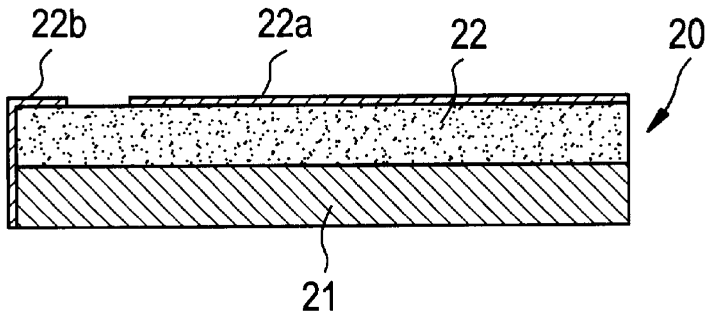
FIG. 10 is a cross-sectional view of the diaphragm according to the second preferred embodiment of the present invention.

FIG. 10 is a diaphragm according to the second preferred embodiment.

The diaphragm 20 is, as the diaphragm 1 shown in FIG. 6*a*, a unimorph type diaphragm having a piezoelectric element 22 adhered on one of surfaces of the metal plate 21. However, the metal plate 21 and the piezoelectric element 22 are configured have substantially the same rectangular shape. On the surface of the piezoelectric element 22, a first electrode 22*a* is provided from one end to a short distance from the other end, and on the other end, a second electrode 22*b* is arranged so as to be continuous with the metal plate 21 via the end surface. In this case, since the two electrodes 22*a*, 22*b* are exposed to the surface of the diaphragm 20, the electrodes are drawn out easily by conductive paste by mounting the diaphragm 20 in the case 4 with the metal plate 21 facing toward the top wall portion 4*a*. Conductive paste in this preferred embodiment is preferably a resilient conductive adhesive as included in the first preferred embodiment.

Figure 11:
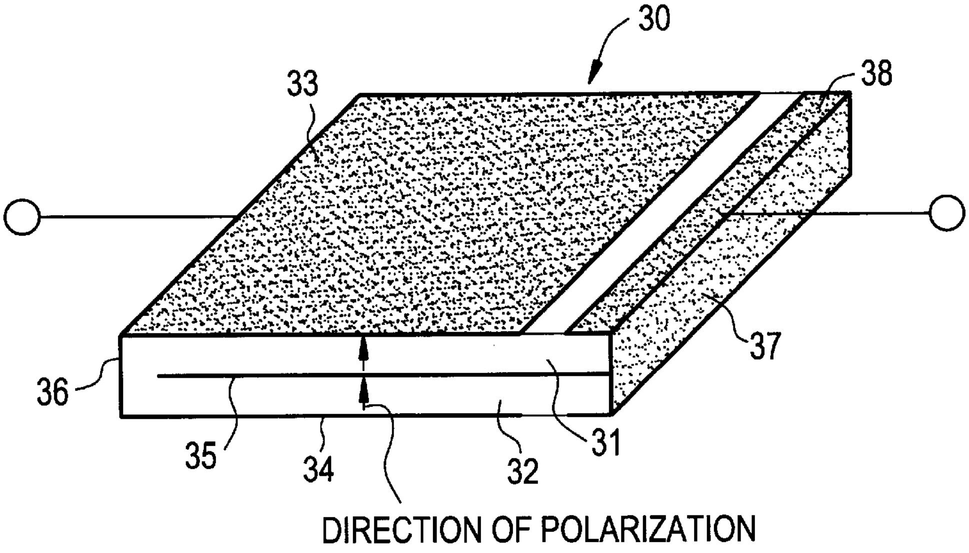
FIG. 11 is a perspective view of the diaphragm according to the third preferred embodiment of the present invention.
Figure 12:
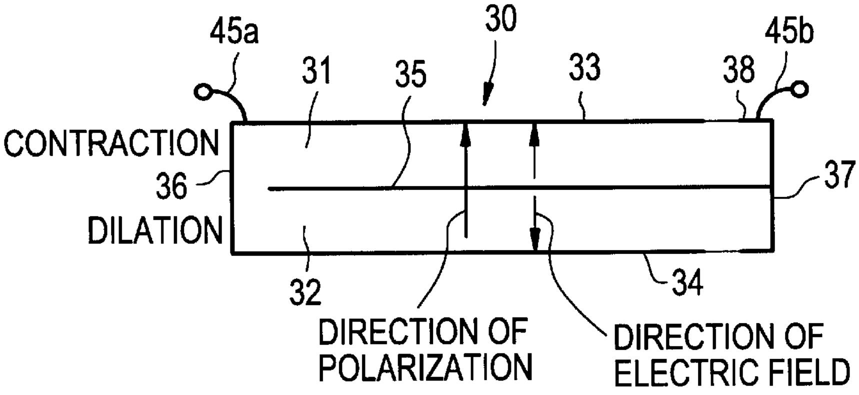
FIG. 12 is a cross-sectional view of the diaphragm shown in FIG. 11.

FIG. 11 and FIG. 12 show the third preferred embodiment of the diaphragm.

The diaphragm 30 has a monolithic structure defined by laminating two piezoelectric ceramic layers 31, 32, and provided with main surface electrodes 33, 34 on the front and back main surfaces and an internal electrode 35 between the ceramics layers 31, 32. Two ceramic layers 31, 32 are polarized in the same direction across the width as shown by a thick arrow in FIG. 12. The main surface electrode 33 on the front surface and the main surface electrode 34 on the back surface have substantially the same width as the shorter end of the diaphragm 30 and somewhat shorter in length than the longitudinal end, and one of the ends thereof is connected to the end surface electrode 36 provided on one of the shorter end surfaces of the diaphragm 30. Therefore, the front and back main surface electrodes 33, 34 are connected with respect to each other. The internal electrode 35 is provided in substantial symmetry with the main surface electrodes 33, 34, and one end of the internal electrode 35 is separated from the end surface electrode 36 described above and the other end thereof is connected to the end surface electrode 37 provided on the other shorter end surface of the diaphragm 30. The diaphragm 30 includes narrow auxiliary electrodes 38 provided on the upper and lower surfaces along the other shorter ends in electrical continuation with the end surface electrode 37.

As in the case of FIG. 4, the diaphragm 30 described above is fixed within the case, and the case is adhered to the substrate. At this time, one of the main surface electrodes 33, 34 is connected to one of the external electrodes on the substrate with resilient conductive paste, and the auxiliary electrode 38 is connected to the other external electrode on the substrate with resilient conductive paste. Then a predetermined alternating voltage is applied between the external electrodes to induce a bending vibration on the diaphragm

30 in the length bending mode. In other words, the diaphragm 30 is vibrated in the bending mode with the shorter ends of the diaphragm acting as fulcrums and the longitudinal center thereof defining the point of the maximum amplitude.

Since the diaphragm of this preferred embodiment is a monolithic structure having no metal plate, and two vibrating regions disposed successively in the direction of thickness vibrate in the opposite direction with respect to each other, a large amount of displacement, that is, a high sound pressure is obtained in comparison with the unimorph type diaphragm.

Figure 13:
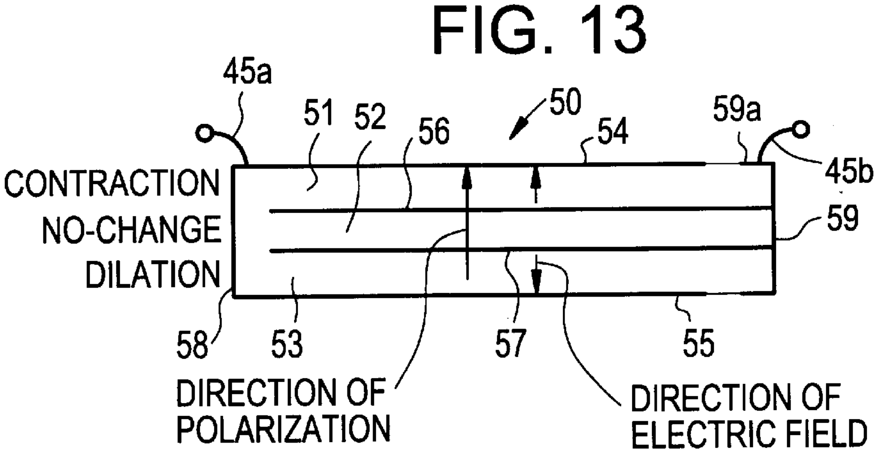
FIG. 13 is a cross-sectional view of the diaphragm according to the fourth preferred embodiment of the present invention.

FIG. 13 is a diaphragm of the fourth preferred embodiment of the present invention. The diaphragm 50 is a monolithic structure having three piezoelectric ceramic layers 51–53 and includes main surface electrodes 54, 55 on the front and back surface of the diaphragm 50 and internal electrodes 56, 57 interposed between each adjacent ceramic layer 51–53. Three ceramic layers 51–53 are polarized in the same direction across the thickness as shown by a thick arrow.

The main surface electrodes 54, 55 have substantially the same width as the shorter end of the diaphragm and somewhat shorter in length than the longitudinal end, and one of the ends thereof is connected to the end surface electrode 8 provided on one of the shorter end surfaces of the diaphragm 50. Therefore, the front and back main surface electrodes 54, 55 are connected with respect to each other. One end of the internal electrodes 56, 57 is separated from the end surface electrode 58, and the other end thereof is connected to the end surface electrode 59 provided on the other shorter end surface of the diaphragm 50. Therefore, the internal electrodes 56, 57 are also connected with respect to each other. The diaphragm 50 includes narrow auxiliary electrodes 59*a* provided on the upper and lower surfaces along the other shorter ends in electrical continuation with the end surface electrode 59. The diaphragm 50 is, as in the case of FIG. 4, fixed in the case and the case is adhered onto the substrate. At this time, one of the main surface electrodes 54, 55 is connected to one of the external electrodes on the substrate with resilient conductive paste, and the auxiliary electrode 59*a* is connected to the other external electrode on the substrate with resilient conductive paste.

For example, when a negative voltage is applied on the main surface electrode 54 and a positive voltage on the auxiliary electrode 59*a*, the electric field in the direction shown by a thin arrow in FIG. 13 is generated. At this time, there is no electric field generated in the intermediate ceramic layer 52 because the internal electrodes 56, 57 located on both sides thereof are at the same potential. The ceramic layer 51 on the front surface contracts in the direction of the plane since the direction of polarization and the direction of the electric field are the same, and the ceramic layer 52 on the back side is dilated in the direction of the plane because the direction of polarization and the direction of the electric field are opposite in direction. The intermediate layer 52 is not subjected to contraction and dilation. Therefore, the diaphragm 50 bends so as to project downwardly. By applying an alternating voltage between the end surface electrodes 58, 59, the diaphragm 50 generates the bending vibration cyclically, thereby generating high sound pressure.

The metal plate and the piezoelectric element do not have to be substantially rectangular, but it may be substantially square. Though the unimorph type diaphragm having a piezoelectric element on one of surfaces of the metal plate and a monolithic diaphragm having laminated piezoelectric elements are described in the preferred embodiment described above, any piezoelectric diaphragm may be used as long as it is substantially square in shape having the first and second diaphragm electrode exposed on one of end surfaces and vibrates in the length bending mode or the area bending mode.

The piezoelectric acoustic component of various preferred embodiments of the present invention includes a piezoelectric buzzer, a piezoelectric receiver, a piezoelectric loudspeaker, a piezoelectric sounder, and ringer.

As is apparent from the description above, according to the first preferred embodiment of the present invention, since the substantially square diaphragm is used, the types of the punch die, jig, or piezoelectric bodies used in the steps of die-cutting the green sheet to cutting the parent substrate may be reduced and the material efficiency is greatly improved, whereby the productive efficiency is greatly improved and the manufacturing cost is greatly reduced.

Since the two opposing sides of the substantially square diaphragm are supported by the supporting portion of the case, the clearance between the other two sides of the diaphragm and the case is sealed so that it vibrates in the length bending mode, the points of maximum displacement exist along the longitudinal centerline of the diaphragm and thus the volume of displacement is greatly increased. Therefore, the efficiency of acoustic conversion is greatly increased in comparison with the disc-shaped diaphragm. Though the substantially square diaphragm is supported along the two sides thereof, the portion intermediate these supported portions is displaced freely, and a much lower frequency in comparison with the disc-shaped diaphragm is obtained. In other words, in order to obtain the sound of the same frequency, the dimensions are greatly reduced.

Since a conductive adhesive for connecting the diaphragm electrode and the external electrode on the substrate has resiliency, even when a large impact load is applied by dropping the apparatus with the piezoelectric acoustic element of preferred embodiments of the present invention mounted therein, the conductive adhesive absorbs the impact so as to prevent disconnection between the diaphragm electrode and the external electrode. Since the Young's modulus of a conductive adhesive in the cured state is low, vibration of the diaphragm is not hindered, thereby improving the sound pressure characteristics.

In the second preferred embodiment of the present invention, since the four sides of the substantially square diaphragm are supported on the supporting portion of the case with the supporting material for providing excitation in the area-bending mode, a piezoelectric acoustic component suitable for the sounder or the ringer used in the resonant region is provided. In this case as well, since the diaphragm electrode and the external electrode on the substrate are connected with a resilient conductive adhesive as in the case of the first preferred embodiment, a piezoelectric acoustic component with greatly improved impact resistant property and sound pressure characteristics in compact size is achieved.

As in the sixth and seventh preferred embodiments of the present invention, since the diaphragm is mounted to the case so that the two diaphragm electrodes are exposed through the opening, application of a conductive adhesive for connecting the diaphragm electrode and the external electrode on the substrate is easily made, and adhesion between the case and the substrate and the electrical connection between the diaphragm electrode and the external electrode are carried out simultaneously, thereby simplifying manufacturing process and greatly reducing the time required for carrying out the process. Therefore, the piezoelectric acoustic component according to the first and second preferred embodiments of the invention is manufactured at a greatly reduced cost.

While the invention has been particularly shown and described with reference to preferred embodiments, it will be understood by those skilled in the art that the foregoing and other changes in form and details can be made without departing from the spirit and scope of the invention.

What is claimed is:

1. A piezoelectric acoustic component comprising:

a substantially square piezoelectric diaphragm having four substantially equal length sides, and having first and second diaphragm electrodes exposed on one of the end portions thereof and vibrating in a length bending mode;

an insulating case having a top wall portion, four side wall portions, and supporting portions inside of two opposing side walls; and a substrate in the shape of a plate having a first and a second external electrodes thereon; wherein said diaphragm is stored within the case with the surface exposing the first and the second diaphragm electrodes facing toward the opposite side of the case from the top wall portion, two opposite sides of the diaphragm being supported on said supporting portion with supporting material, and the clearance between the diaphragm and the remaining two side walls are sealed with a resilient sealing material, such that an acoustic space is defined between the diaphragm and the top wall portion of the case, an end portion of at least one of said four side wall portions of said case is adhered onto said substrate, the first diaphragm electrode on said diaphragm is electrically connected to the first external electrode with a resilient conductive adhesive, and said second diaphragm electrode is electrically connected to the second external electrode with a resilient conductive adhesive.

2. A piezoelectric acoustic component as set forth in claim 1, wherein said diaphragm is a unimorph type piezoelectric diaphragm having a piezoelectric element adhered on one of the surfaces of the metal plate at the position displaced toward one of the side which is supported by the supporting portion of the case, the electrode on one of the surfaces of the piezoelectric element exposed outside constitutes the first diaphragm electrode, an exposed portion of the metal plate is provided on the other side of the surface having a piezoelectric element of the diaphragm is adhered, said exposed portion constitutes the second diaphragm electrode, and the diaphragm is mounted to the case with the metal plate facing toward the top wall of the case.

3. A piezoelectric acoustic component as set forth in claim 1, wherein said resilient conductive adhesive is a conductive adhesive having Young's modulus of about $1\times10^5$–$2\times10^9$ N/m$^2$.

4. A piezoelectric acoustic component as set forth in claim 1, wherein the supporting material that supports the two opposing sides of the diaphragm on the supporting portion is the same material as the resilient sealing material.

5. A piezoelectric acoustic component as set forth in claim 1, wherein the piezoelectric diaphragm is made of PZT.

6. A piezoelectric acoustic component as set forth in claim 1, wherein the case is made of resin.

7. A piezoelectric acoustic component as set forth in claim 1, wherein said first and second external electrodes extend from a front surface to a back surface of said case via through holes provided in said case.

8. A piezoelectric acoustic component as set forth in claim 1, wherein a sound releasing hole is provided at the approximate center of the top wall portion of said case.

9. A piezoelectric acoustic component as set forth in claim 1, wherein grooves are provided on the opening edges of the two opposing side wall portions of said case.

10. A piezoelectric acoustic component as set forth in claim 1, wherein the opening edge of one of the side wall portions is provided with a braking notch.

11. A piezoelectric acoustic component comprising:

a substantially square piezoelectric diaphragm having a first and second diaphragm electrodes exposed on one of the end portions thereof and vibrating in the area bending mode;

an insulating case having a top wall portion, four side wall portions, and a supporting portion inside of said four side wall portions; and a substrate in the shape of a plate having first and second external electrodes thereon; wherein said diaphragm is stored in the case with the surface exposing the first and the second diaphragm electrodes facing toward the opposite side of the case from the top wall portion, the four sides of the diaphragm are supported on said supporting portion with supporting material such that an acoustic space is defined between the diaphragm and the case, an end portion of at least one of said side wall portions of said case is adhered onto said substrate, the first diaphragm electrode of said diaphragm is electrically connected to the first external electrode with a resilient conductive adhesive, and said second diaphragm electrode is electrically connected to the second external electrode with a resilient conductive adhesive.

12. A piezoelectric acoustic component as set forth in claim 11, wherein said diaphragm is a unimorph type piezoelectric diaphragm having a piezoelectric element adhered on one of the surfaces of the metal plate at the position displaced toward one of the side which is supported by the supporting portion of the case, the electrode on one of the surfaces of the piezoelectric element exposed outside constitutes the first diaphragm electrode, an exposed portion of the metal plate is provided on the other side of the surface having a piezoelectric element of the diaphragm is adhered, said exposed portion constitutes the second diaphragm electrode, and the diaphragm is mounted to the case with the metal plate facing toward the top wall of the case.

13. A piezoelectric acoustic component as set forth in claim 11, wherein said resilient conductive adhesive is a conductive adhesive having a Young's modulus of about $1\times10^5$–$2\times10^9$ N/m$^2$.

14. A piezoelectric acoustic component as set forth in claim 11, wherein the supporting material that supports the two opposing sides of the diaphragm on the supporting portion is formed of the same material as the resilient sealing material.

15. A piezoelectric acoustic component as set forth in claim 11, wherein the piezoelectric diaphragm is made of PZT.

16. A piezoelectric acoustic component as set forth in claim 11, wherein the case is made of resin.

17. A piezoelectric acoustic component as set forth in claim 11, wherein said first and second external electrodes extends from a front surface to a back surface of said case via through holes provided in said case.

18. A piezoelectric acoustic component as set forth in claim 11, wherein a sound releasing hole is provided at the approximate center of the top wall portion of said case.

19. A piezoelectric acoustic component comprising:

a substantially rectangular piezoelectric diaphragm having first and second diaphragm electrodes exposed on one of the end portions thereof and vibrating in a length bending mode;

an insulating case having a top wall portion, four side wall portions, and supporting portions inside of two opposing side walls; and a substrate in the shape of a plate having a first and a second external electrodes thereon; wherein said diaphragm is stored within the case with the surface exposing the first and the second diaphragm electrodes facing toward the opposite side of the case from the top wall portion, two opposite sides of the diaphragm being supported on said supporting portion with supporting material, and the clearance between the diaphragm and the remaining two side walls are sealed with a resilient sealing material, such that an acoustic space is defined between the diaphragm and the top wall portion of the case, an end portion of at least one of said four side wall portions of said case is adhered onto said substrate, the first diaphragm electrode on said diaphragm is electrically connected to the first external electrode with a resilient conductive adhesive, and said second diaphragm electrode is electrically connected to the second external electrode with a resilient conductive adhesive.

20. A piezoelectric acoustic component as set forth in claim 19, wherein said diaphragm is a unimorph type piezoelectric diaphragm having a piezoelectric element adhered on one of the surfaces of the metal plate at the position displaced toward one of the side which is supported by the supporting portion of the case, the electrode on one of the surfaces of the piezoelectric element exposed outside constitutes the first diaphragm electrode, an exposed portion of the metal plate is provided on the other side of the surface having a piezoelectric element of the diaphragm is adhered, said exposed portion constitutes the second diaphragm electrode, and the diaphragm is mounted to the case with the metal plate facing toward the top wall of the case.

21. A piezoelectric acoustic component as set forth in claim 19, wherein said resilient conductive adhesive is a conductive adhesive having Young's modulus of about $1\times10^5$–$2\times10^9$ N/m$^2$.

22. A piezoelectric acoustic component as set forth in claim 19, wherein the supporting material that supports the two opposing sides of the diaphragm on the supporting portion is the same material as the resilient sealing material.

23. A piezoelectric acoustic component as set forth in claim 19, wherein the piezoelectric diaphragm is made of PZT.

24. A piezoelectric acoustic component as set forth in claim 19, wherein the case is made of resin.

25. A piezoelectric acoustic component as set forth in claim 19, wherein said first and second external electrodes extend from a front surface to a back surface of said case via through holes provided in said case.

26. A piezoelectric acoustic component as set forth in claim 19, wherein a sound releasing hole is provided at the approximate center of the top wall portion of said case.

27. A piezoelectric acoustic component as set forth in claim 19, wherein grooves are provided on the opening edges of the two opposing side wall portions of said case.

28. A piezoelectric acoustic component as set forth in claim 19, wherein the opening edge of one of the side wall portions is provided with a braking notch.

29. A piezoelectric acoustic component comprising:

a substantially rectangular piezoelectric diaphragm having a first and second diaphragm electrodes exposed on one of the end portions thereof and vibrating in the area bending mode;

an insulating case having a top wall portion, four side wall portions, and a supporting portion inside of said four side wall portions; and a substrate in the shape of a plate having first and second external electrodes thereon; wherein said diaphragm is stored in the case with the surface exposing the first and the second diaphragm electrodes facing toward the opposite side of the case from the top wall portion, the four sides of the diaphragm are supported on said supporting portion with supporting material such that an acoustic space is defined between the diaphragm and the case, an end portion of at least one of said side wall portions of said case is adhered onto said substrate, the first diaphragm electrode of said diaphragm is electrically connected to the first external electrode with a resilient conductive adhesive, and said second diaphragm electrode is electrically connected to the second external electrode with a resilient conductive adhesive.

30. A piezoelectric acoustic component as set forth in claim 29, wherein said diaphragm is a unimorph type piezoelectric diaphragm having a piezoelectric element adhered on one of the surfaces of the metal plate at the position displaced toward one of the side which is supported by the supporting portion of the case, the electrode on one of the surfaces of the piezoelectric element exposed outside constitutes the first diaphragm electrode, an exposed portion of the metal plate is provided on the other side of the surface having a piezoelectric element of the diaphragm is adhered, said exposed portion constitutes the second diaphragm electrode, and the diaphragm is mounted to the case with the metal plate facing toward the top wall of the case.

31. A piezoelectric acoustic component as set forth in claim 29, wherein said resilient conductive adhesive is a conductive adhesive having a Young's modulus of about $1\times10^5$–$2\times10^9$ N/m$^2$.

32. A piezoelectric acoustic component as set forth in claim 29, wherein the supporting material that supports the two opposing sides of the diaphragm on the supporting portion is formed of the same material as the resilient sealing material.

33. A piezoelectric acoustic component as set forth in claim 29, wherein the piezoelectric diaphragm is made of PZT.

34. A piezoelectric acoustic component as set forth in claim 29, wherein the case is made of resin.

35. A piezoelectric acoustic component as set forth in claim 29, wherein said first and second external electrodes extends from a front surface to a back surface of said case via through holes provided in said case.

36. A piezoelectric acoustic component as set forth in claim 29, wherein a sound releasing hole is provided at the approximate center of the top wall portion of said case.

* * * * *